US012604732B2

(12) United States Patent
Roth et al.

(10) Patent No.: US 12,604,732 B2
(45) Date of Patent: Apr. 14, 2026

(54) POWER ELECTRONICS CARRIER

(71) Applicant: Infineon Technologies Austria AG, Villach (AT)

(72) Inventors: Alexander Roth, Zeitlarn (DE); Richard Knipper, Regensburg (DE)

(73) Assignee: Infineon Technologies Austria AG, Villach (AT)

( * ) Notice: Subject to any disclaimer, the term of this patent is extended or adjusted under 35 U.S.C. 154(b) by 653 days.

(21) Appl. No.: 17/186,224

(22) Filed: Feb. 26, 2021

(65) Prior Publication Data

US 2022/0278017 A1 Sep. 1, 2022

(51) Int. Cl.
| | |
|---|---|
| *H01L 23/373* | (2006.01) |
| *H01L 21/48* | (2006.01) |
| *H01L 23/31* | (2006.01) |
| *H01L 25/16* | (2023.01) |

(52) U.S. Cl.
CPC ...... *H01L 23/3735* (2013.01); *H01L 21/4871* (2013.01); *H01L 23/3121* (2013.01); *H01L 25/16* (2013.01)

(58) Field of Classification Search
CPC ............. H01L 21/4853; H01L 21/4871; H01L 23/3121; H01L 23/3735; H01L 23/4334; H01L 23/49816; H01L 23/49894; H01L 25/16; H01L 2224/3225; H01L 2224/48091; H01L 2224/48137; H01L 2224/48227; H01L 2224/73265; H01L 2924/181; H01L 2924/19107
See application file for complete search history.

(56) References Cited

U.S. PATENT DOCUMENTS

| | | | |
|---|---|---|---|
| 8,021,920 B2 | 9/2011 | Schulz-Harder et al. | |
| 2001/0045573 A1* | 11/2001 | Waitl | H01L 33/483 |
| | | | 257/E31.118 |
| 2002/0185717 A1* | 12/2002 | Eghan | H01L 23/055 |
| | | | 257/E23.092 |
| 2006/0109632 A1* | 5/2006 | Berlin | H05K 1/0206 |
| | | | 257/E23.105 |
| 2007/0257343 A1* | 11/2007 | Hauenstein | H01L 23/49861 |
| | | | 257/784 |
| 2010/0013085 A1 | 1/2010 | Oi et al. | |
| 2010/0117219 A1 | 5/2010 | Oka et al. | |
| 2010/0127389 A1 | 5/2010 | Obiraki et al. | |
| 2016/0293528 A1* | 10/2016 | Otremba | H01L 23/49586 |
| 2018/0182692 A1* | 6/2018 | Danno | H01L 23/562 |
| 2018/0352653 A1* | 12/2018 | Kahrimanovic | H01L 23/49582 |

FOREIGN PATENT DOCUMENTS

| | | | | | |
|---|---|---|---|---|---|
| GB | 2293918 A | * | 4/1996 | ........ | H01L 23/3121 |
| JP | 4055373 B2 | * | 3/2008 | | |

OTHER PUBLICATIONS

JP 4055373 B2, Machine Translation. (Year: 2008).*

* cited by examiner

*Primary Examiner* — Brian Turner
(74) *Attorney, Agent, or Firm* — Murphy, Bilak & Homiller, PLLC

(57) ABSTRACT

A power electronics device comprises a power electronics carrier includes a non-corrosive metal substrate and a region of electrical isolation material that forms a direct interface with the metal substrate, and a first semiconductor die mounted on the region of electrical isolation material, and a coefficient of thermal expansion of the region of electrical isolation material substantially matches a coefficient of thermal expansion of metal from the metal substrate at the direct interface.

12 Claims, 8 Drawing Sheets

POWER ELECTRONICS CARRIER

BACKGROUND

Many applications such as automotive and industrial applications utilize power electronic circuitry such as IGBTs (insulated gate bipolar transistors), power MOSFETs (metal oxide semiconductor field effect transistors), power diodes, etc. For example, common power circuits include single and multi-phase half-wave rectifiers, single and multi-phase full-wave rectifiers, voltage regulators, etc. Integrated power modules (IPMs) include both power electronic circuitry and the logic circuitry the controls the switching of the power electronic circuitry. Integrated power modules (IPMs) can include a multi-layer power electronic substrate such as a DBC (direct bonded copper), IMS (insulated metal substrate) or AMB (active metal brazed) substrate. The raw materials used to form these multi-layer power electronic substrates, such as copper, aluminum, ceramic, etc., and/or the processing steps used to form these multi-layer power electronic substrates, such as oxidation, etching, deposition, etc., add significant cost to these components. Particularly with respect to integrated power modules designed for low-cost and/or high-volume applications, the increased cost associated for these multi-layer power electronic substrates is problematic and may be cost-prohibitive. Thus, there is a need for a high-performance power electronics substrate at lower cost.

SUMMARY

A power electronics device is disclosed. According to an embodiment, the power electronics device comprises a power electronics carrier comprising a non-corrosive metal substrate and a region of electrical isolation material that forms a direct interface with the metal substrate, and a first semiconductor die mounted on the region of electrical isolation material, and a coefficient of thermal expansion of the region of electrical isolation material substantially matches a coefficient of thermal expansion of metal from the metal substrate at the direct interface.

Separately or in combination, the metal substrate comprises steel.

Separately or in combination, the metal from the metal substrate at the direct interface is steel.

Separately or in combination, the region of electrical isolation material comprises an electrically insulating non-crystalline material that is disposed at the direct interface with the metal substrate.

Separately or in combination, the electrically insulating non-crystalline material comprises glass.

Separately or in combination, the power electronics devices further comprises a first bond pad disposed on the region of electrical isolation material, and the first semiconductor die is mounted on the first bond pad.

Separately or in combination, the power electronics devices further comprises a second semiconductor die mounted on the power electronics carrier, the second semiconductor die is electrically isolated from the first semiconductor die by the region of electrical isolation material.

Separately or in combination, the second semiconductor die is a power transistor, and the first semiconductor die is a logic device that is configured to control the power transistor.

Separately or in combination, the region of electrical isolation material comprises a first layer of the electrically insulating non-crystalline material that is disposed on an upper surface of the metal substrate, the semiconductor package further comprises a second bond pad disposed on the region of electrical isolation material, and the second semiconductor die is mounted on the second bond pad.

Separately or in combination, the first bond pad extends past a lateral edge side of the region of electrical isolation material and directly contacts the upper surface of the metal substrate.

Separately or in combination, the region of electrical isolation material is disposed within a recess or opening in an upper surface of the metal substrate, and the second semiconductor die is mounted directly on a region of the upper surface of the metal substrate that is adjacent to the recess or opening.

Separately or in combination, the power electronics devices further comprises an encapsulant body of electrically insulating material that encapsulates the first semiconductor die.

Separately or in combination, the semiconductor package further comprises a first lead that is electrically connected to the semiconductor die and is exposed from the encapsulant body, and the metal substrate and the first lead are constituent parts of a steel lead frame.

Separately or in combination, a lower surface of the metal substrate that is opposite from the first semiconductor die is exposed from the encapsulant body.

A power electronics carrier is disclosed. According to an embodiment, the power electronics carrier comprises a non-corrosive metal substrate, and a region of electrical isolation material that forms a direct interface with the metal substrate, and a coefficient of thermal expansion of the region of electrical isolation material substantially matches a coefficient of thermal expansion of the metal at the direct interface.

Separately or in combination, the metal at the direct interface comprises steel.

Separately or in combination, the electrically insulating non-crystalline material comprises glass.

A method of producing a power electronics carrier is disclosed. Separately or in combination, the method comprises providing a metal substrate, and forming a region of electrical isolation material on the metal substrate such that the region of electrical isolation material directly interfaces with the metal substrate, and a coefficient of thermal expansion of the region of electrical isolation material substantially matches a coefficient of thermal expansion of metal from the metal substrate at the direct interface.

Separately or in combination, the method further comprises forming a first bond pad on the region of electrical isolation material by printing a $10\,\mu m$-$120\,\mu m$ thick layer of a first thermally conductive material on the region of electrical isolation material, and the first thermally conductive material comprises copper.

Separately or in combination, the method further comprises forming a recess or opening in an upper surface of the metal substrate, and forming the region of electrical isolation material comprises filling the recess or opening with the electrically insulating non-crystalline material.

BRIEF DESCRIPTION OF THE FIGURES

The elements of the drawings are not necessarily to scale relative to each other. Like reference numerals designate corresponding similar parts. The features of the various illustrated embodiments can be combined unless they exclude each other. Embodiments are depicted in the drawings and are detailed in the description which follows.

FIG. 1A illustrates a side-view of the power electronics carrier, and FIG. 1B illustrates a plan-view of the power electronics carrier.

DETAILED DESCRIPTION

Embodiments of a power electronics carrier that can incorporated into an integrated power module are described herein. The power electronics carrier is formed from materials that are relatively inexpensive and easy to process in comparison to the materials such as copper, aluminum, ceramic, etc., and corresponding structures that are used in advanced multi-layer power power electronics carriers, e.g., DBC substrates, IMS substrates, AMB substrates, etc. For example, the power electronics carrier can comprise a metal substrate that comprises in whole or in part a low-cost non-corrosive metal such as steel. The power electronics carrier further comprises a region of electrical isolation material that interfaces with the metal substrate. The electrical isolation material allows for multiple semiconductors dies (e.g., power devices, logic devices) to be mounted power electronics carrier and electrically isolated from one another. A structured conductive layer, such as a film of copper, can be provided on the region of electrical isolation material to enable die attach and/or interconnect. The region of electrical isolation material is CTE (coefficient of thermal expansion) matched to the metal substrate. For example, the region of electrical isolation material can comprise a glass material with a CTE that is substantially close to the metal to which it interfaces with, e.g., steel. This allows the power electronics carrier able to withstand temperature cycles, e.g., from manufacture or operation.

Figures 1, 1A, 1B:
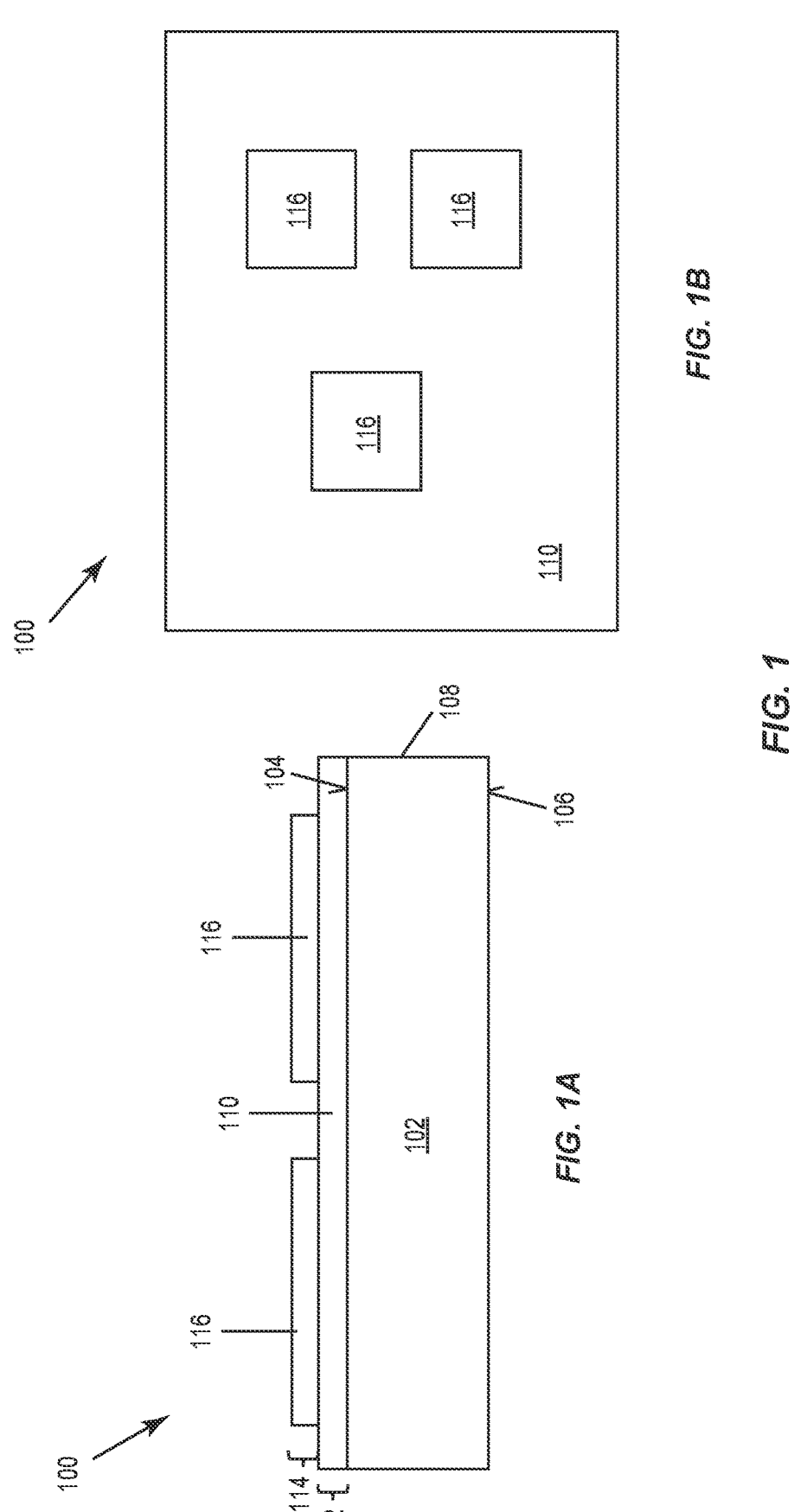
FIG. 1, which includes
FIGS. 1A, 1B, illustrates a power electronics carrier, according to an embodiment.

Referring to FIG. 1, a power electronics carrier 100 comprises a non-corrosive metal substrate 102. In this context, "non-corrosive" refers to the fact that the constituent metal of the metal substrate 102 has a particular composition and/or is coated with a particular type of coating such that the constituent metal does not significantly convert into an oxide, hydroxide, or sulfide over the useful life of the power electronics carrier 100. The non-corrosive metal substrate 102 comprises a substantially planar upper surface 104, a substantially planar rear surface 106 opposite from the upper surface 104, and outer edge sides 108 extending between the upper and rear surface 106s.

Generally speaking, the non-corrosive metal substrate 102 can comprise any of a variety of corrosion resistant metals such as iron, chromium, aluminium, copper, zinc, nickel, gold, bronze, etc., and alloys thereof. In an embodiment, the non-corrosive metal substrate 102 comprises steel, which is an alloy of iron and carbon. More particularly, the non-corrosive metal substrate 102 may comprise stainless steel, which is an alloy of iron, carbon, and chromium, wherein the level of chromium sufficient to provide corrosion resistance (e.g., least 11%).

According to an embodiment, the metal substrate 102 is a continuous body of one type of metal. For example, the metal substrate 102 can be a continuous body of a single type of metal, e.g., steel. In another embodiment, the metal substrate 102 comprises different layers of metal. For example, the metal substrate 102 can comprise a first layer 103 of a first type of metal (e.g., steel) that extends to the rear surface 106 and a second layer 105 of a second type of metal (e.g., copper, aluminium, alloys thereof) that extend to the upper surface 104. The first type of metal can form a substantial majority of the overall material volume, thereby enabling lower cost. The second type of metal can be selected to meet other considerations, such as the CTE matching requirements to be described below.

The power electronics carrier 100 further comprises a region of electrical isolation material 110. The region of electrical isolation material 110 forms a direct interface with the metal substrate 102. That is, the region of electrical isolation material 110 directly contacts a metal surface of the metal substrate 102. In the depicted embodiment, the region of electrical isolation material 110 directly interfaces with the upper surface 104 of the metal substrate 102. As will be illustrated in further embodiments to be described below, the region of electrical isolation material 110 may alternatively directly interface with one or more interior surfaces of the metal substrate 102 that are below the upper surface 104.

The region of electrical isolation material 110 is formed from or comprises an electrically insulating material. Generally speaking, this electrically insulating material can be any material with a sufficient dielectric strength to withstand the operating voltages of a semiconductor die mounted thereon (e.g., a power semiconductor device), and can be CTE matched with the metal substrate 102 according to the concepts described below. According to an embodiment, the region of electrical isolation material 110 comprises an electrically insulating non-crystalline material that is disposed at the direct interface with the metal substrate 102. This electrically insulating non-crystalline material can have an amorphous crystalline structure (e.g., glass) or a polycrystalline crystalline structure (e.g., glass ceramics). In an embodiment, the region of electrical isolation material 110 comprises glass, e.g., quartz glass, silica glass, soda lime glass, photostructurable glasses (e.g., foturan), float glass, porcelains, polymer thermoplastics, polymer glasses, acrylic glass, polycarbonate, polyethylene terephthalate, etc. In an embodiment, the region of electrical isolation material 110 comprises glass-ceramic, e.g., $ZnO$—$Al_2O_3$—$SiO_2$ type. According to an embodiment, the region of electrical isolation material 110 is transformed into a paste, the paste is screen-printed onto the metal substrate 102 and subsequently fired to fuse the electrical isolation material 110 to the metal substrate 102. In another embodiment, the non-crystalline material can be bonded to the metal substrate 102, e.g., using adhesive, or formed on the metal substrate 102 using a deposition technique. Alternatively, the region of electrical isolation material 110 may comprise a microcrystalline material, i.e., a crystalline material wherein the crystallized substance or rock that contains small crystals visible only through microscopic examination, e.g., on the order of 1 μm or less. An example of this micro-crystalline material is microcrystalline silicon.

According to an embodiment, the region of electrical isolation material 110 comprises a first layer 112 of the electrically insulating non-crystalline material (e.g., glass) that is disposed on the upper surface 104 metal substrate 102. This first layer 112 of the electrically insulating non-crystalline material can cover an entire area of the upper surface 104 (as shown) or selected portions thereof. Generally speaking, the first layer 112 of the electrically insulating non-crystalline material may have a thickness in the range of 10 µm-500 µm. In embodiments, this thickness can be in the range of 20 µm-100 µm, or more particularly in the range of 20 µm-40 µm or in the range of 40 µm-80 µm, for example.

A coefficient of thermal expansion of the region of electrical isolation material 110 substantially matches a coefficient of thermal expansion of the metal from the metal substrate 102 at the direct interface between the two materials. That is, the two interfacing materials are substantially CTE matched to one another. In this regard, "substantially matches" means that the difference in coefficient of thermal expansion between the two materials is no greater than 3 ppm (parts per million/Kelvin). For instance, if the material of the metal substrate 102 has a coefficient of thermal expansion of $12 \times 10^{-6}$ M/m° C., the region of electrical isolation material 110 is substantially CTE matched if it has a coefficient of thermal expansion of between $9\text{-}16 \times 10^{-6}$ M/m° C. (+/−25% in percentage terms). The CTE match of the materials may be selected to meet predefined criteria to ensure reliable operation. For example, a coefficient of thermal expansion of the region of electrical isolation material 110 relative to the metal to which it interfaces with can be selected so that the power electronics carrier 100 does not crack or become irreparably damaged by thermal cycling required for production or operation of a power module that utilizes the power electronics carrier 100. For example, the coefficient of thermal expansion of the region of electrical isolation material 110 relative to the metal substrate 102 can be selected to prevent a physical crack due to CTE mismatch at temperatures associated with a soldering process, e.g., 250° C., at least 300°, at least 400° C., etc. Separately or in combination, the coefficient of thermal expansion of the region of electrical isolation material 110 relative to the metal substrate 102 can be selected to withstand steady state operation of semiconductor dies mounted thereon.

According to an embodiment, the power electronics carrier 100 further comprises a structured metallization layer 114 disposed on the region of electrical isolation material 110. In the depicted embodiment, the structured metallization layer 114 is formed into three bond pads 116. Due to the electrically insulating properties of the electrical isolation material, each of these bond pads 116 are electrically isolated from one another.

Generally speaking, the structured metallization layer 114 can comprise any thermally and/or electrically conductive material. According to one embodiment, the structured metallization layer 114 comprises a first thermally conductive material that is different from a metal of the metal substrate 102. For instance, in an embodiment wherein the metal substrate 102 is a steel substrate or comprises steel, the structured metallization layer 114 comprise a material with better electrical and/or thermal conductivity, e.g., copper, aluminium, and alloys thereof.

According to an embodiment, the structured metallization layer 114 is formed using a thick-film printing process. According to this technique, a frame (stencil) having the desired geometry of the particular features is placed on the electrical isolation material. A conductive material, e.g., copper, aluminium, etc., is suspended within a solvent or polymer, to create a printable "ink." This ink is applied within the desired area of the frame and subsequently cured, followed by removed of the frame. This technique offers a great deal of flexibility with respect to the geometry of the conductive features.

Generally speaking, a thickness of the structured metallization layer 114 may be in the range of 10 µm-500 µm. In exemplary embodiments, this thickness can be in the range of 30 µm-120 µm, or more particularly in the range of 60 µm-90 µm, for example. The thickness of any two or more bond pads 116 can be different from one another. Moreover, the thickness of the electrically insulating non-crystalline material and the first thermally conductive material disposed thereon can be selected in tandem to provide desired thermal characteristics. For instance, the region of electrical isolation material 110 can be a layer of glass that is about 20 µm-80 µm thick and the bond pads 116 can be regions of copper or copper alloy that is about 20 µm-120 µm thick. This material composition and thickness provides good thermal conductivity between the bond pads 116 and the metal substrate 102 while maintaining adequate electrical isolation and dielectric strength that is suitable for power electronics applications.

Figure 2:
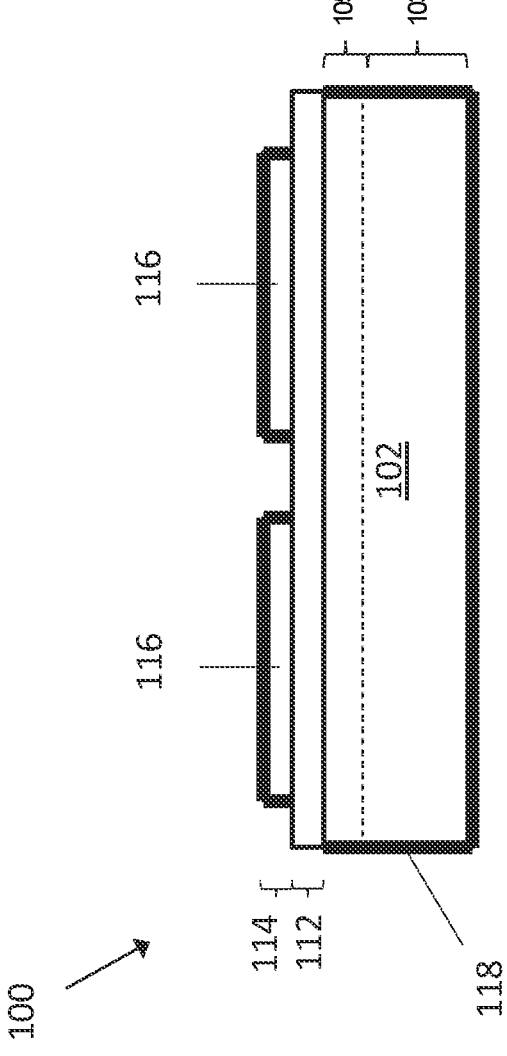
FIG. 2 illustrates a side-view of a power electronics carrier, according to an embodiment.

Referring to FIG. 2, a power electronics carrier 100 is a depicted, according to another embodiment. The power electronics carrier 100 of FIG. 2 is substantially similar to that of FIG. 1, except that it additionally includes a metal coating 118 that covers outer surfaces of the metal substrate 102. The metal coating 118 can be formed by a plating technique such as electroplating (galvanic plating) or electroless plating. The metal coating 118 can comprise a metal that is resistant to corrosion and or ionic contamination. For example, the metal coating 118 can comprise nickel, gold, silver, bronze, etc., and alloys thereof. The metal coating 118 can be used to provide a non-corrosive metal substrate 102 from a metal that is not corrosion resistant (e.g., standard steel or other iron-based alloys) or to enhance the corrosion resistance of a metal substrate 102 that is formed from a corrosion resistant metal, e.g., stainless steel. Additionally, or alternatively, the metal coating 118 can be used to prevent contamination, e.g., from a diffusion soldering technique.

Figure 3:
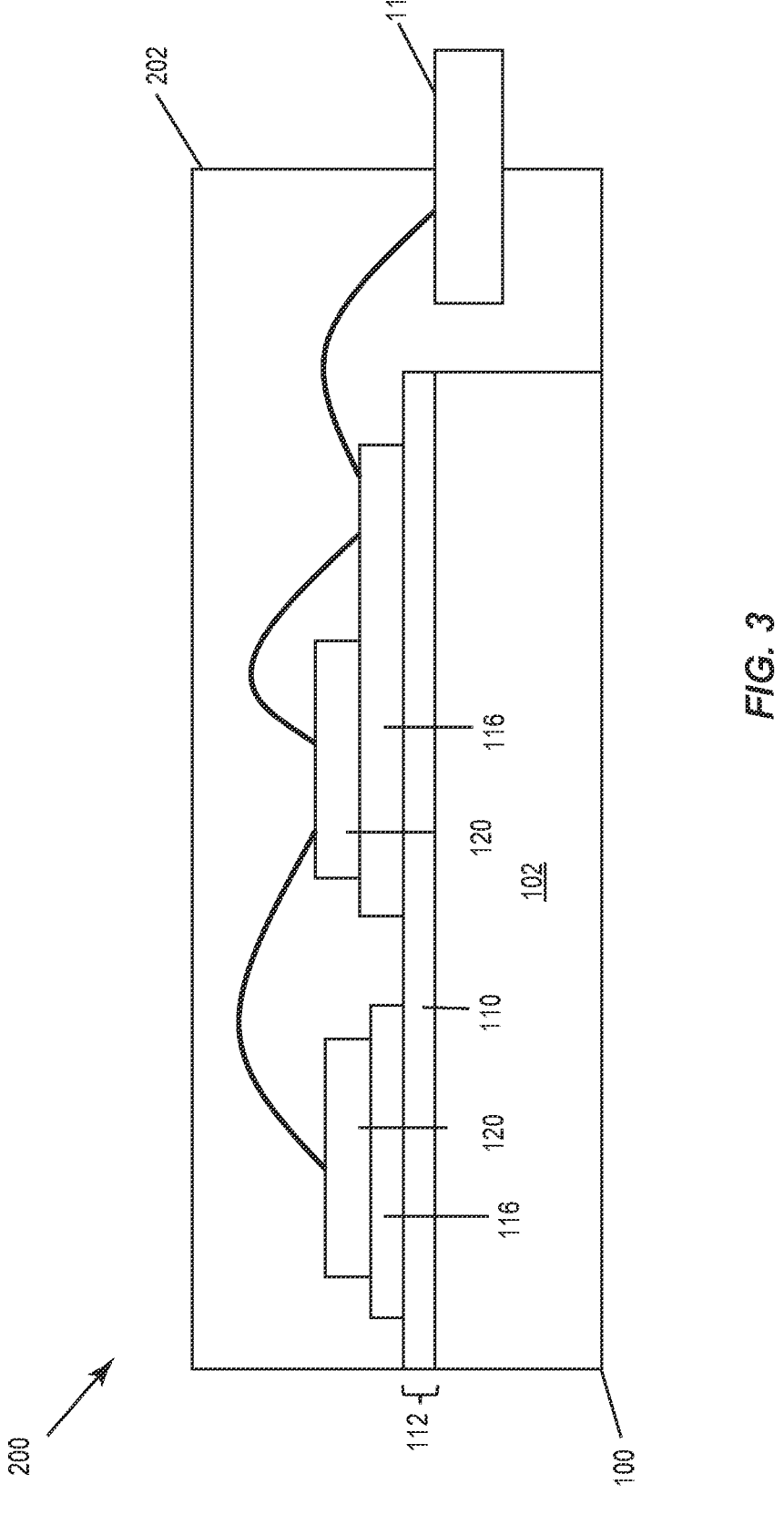
FIG. 3 illustrates a cross-sectional view of a semiconductor package that comprises a power electronics carrier, according to an embodiment.

Referring to FIG. 3, a semiconductor package 200 is depicted, according to an embodiment. The semiconductor package 200 comprises the power electronics carrier 100 and a number of electrically conductive leads 119. The leads 119 and the metal substrate 102 can be part of a lead-frame structure that is formed from the same underlying material, e.g., steel, stainless steel, etc. This lead-frame can be provided in strip format so that multiple semiconductor packages 200 can be manufactured in parallel, wherein the individual leads 119 and packages 200 are detached from one another and/or the lead frame strip at the end of the process.

The semiconductor package 200 comprises a number of semiconductor dies 120 mounted on the bond pads 116. A conductive adhesive such as solder, sinter, tape, etc., may be provided to form a mechanical connection and (optionally) electrical conductive connection between the semiconductor dies 120 and the bond pads 116. Generally speaking, the semiconductor dies 120 can have a wide variety of device configurations, e.g., a discrete device such as a MOSFET, IGBT, diode, etc., or an integrated circuit such as a controller, driver, etc. According to an embodiment, one of the semiconductor dies 120 is configured as a power transistor (e.g., IGBT, MOSFET, etc.) and another one of the semiconductor dies 120 is configured as a control device (e.g., CMOS logic die) that is configured to control a switching operation of the power transistor. As shown, electrical interconnections between the terminals of the semiconductor dies 120 (e.g., gate, source, drain, etc.) and the bond pads 116 and/or leads 119 are provided by conductive bond wires. Alternatively, these electrical interconnections may be provided by other types of electrical interconnect structures, e.g., metal clips, ribbons, etc.

The semiconductor package 200 additionally comprises an encapsulant body 202 that encapsulates each of the semiconductor dies 120 and the associated electrical connections. The encapsulant body 202 comprises an electrically insulating encapsulant material, e.g., mold compound, thermosetting plastic, laminate material, polymers with or without fillers, etc. Outer ends of the leads 119 are exposed from the encapsulant body 202. These exposed ends of the leads 119 provide externally accessible points of electrical contact to the various terminals of the semiconductor die. The lower surface 106 of the metal substrate 106 is exposed from the encapsulant body 102, and can be mated with an external device, such as a PCB or heat sink.

The power electronics substrate 100 provides to a multi-layer power electronics substrate such as a DBC substrate, IMS substrate or AMB substrate. Any lower thermal performance associated with the substrate materials (e.g., steel and glass) may be compensated by the lower sheet thickness needed for these structures since the electrical isolation is buried in the package. Materials such as steel and mold compound are well established components, allowing for easy and failure free assembly.

Figure 4:
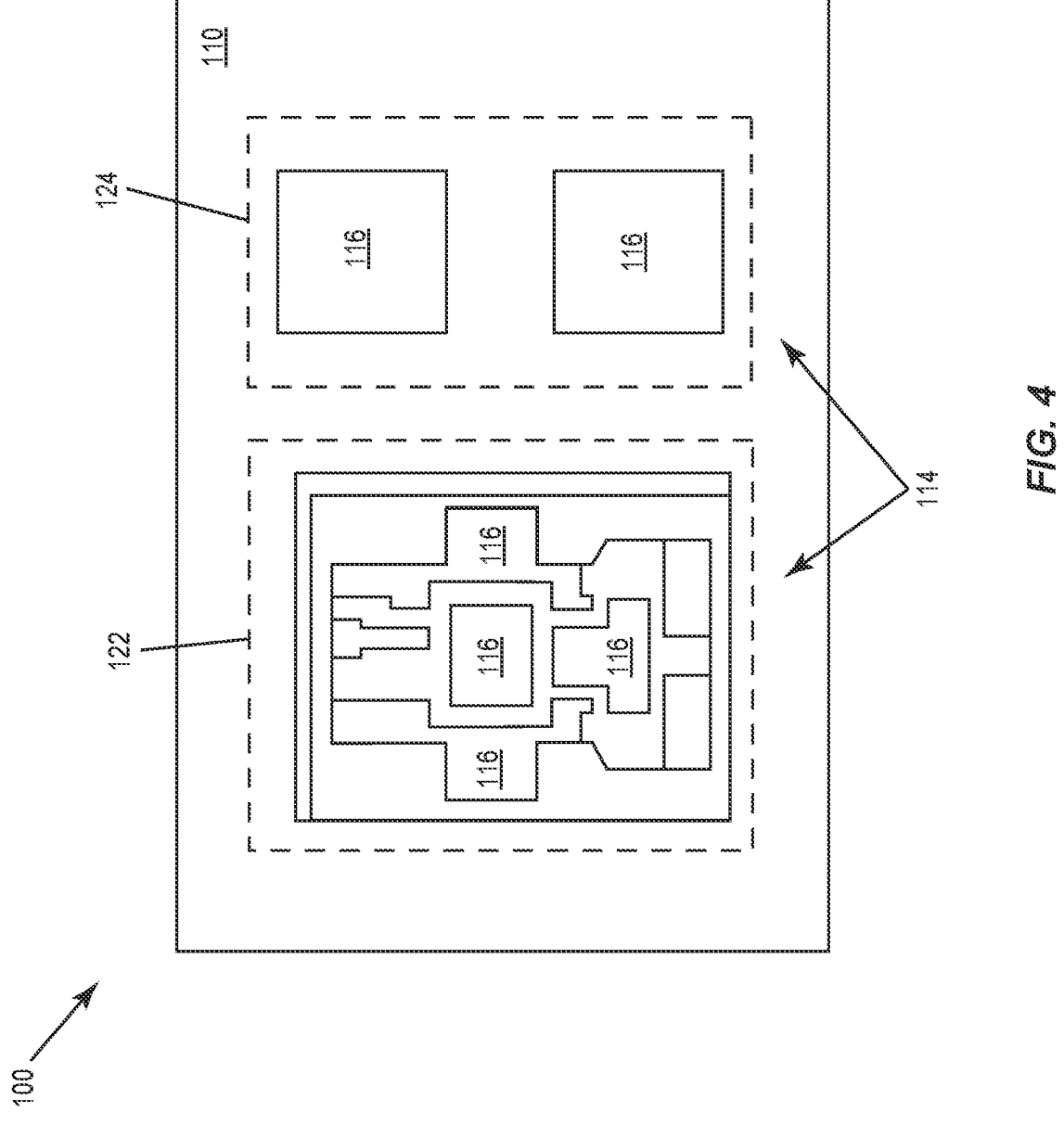
FIG. 4 illustrates a plan-view of a power electronics carrier, according to an embodiment.

Referring to FIG. 4, a plan-view of a power electronics carrier 100 is depicted, according to an embodiment. This power electronics carrier 100 can be incorporated into a molded semiconductor package, e.g., in a similar manner as the device described with reference to FIG. 3. Alternatively, this power electronics carrier 100 can be incorporated into an integrated power module with an open housing. In this embodiment, the structured metallization layer 114 comprises a logic device region 122 and a power device region 124. The power device region 124 comprises bond pads 116 that accommodate power switching devices, e.g., IGBTs, MOSFETs, etc., mounted therein. The logic device region 122 comprises bond pads 116 that are electrically isolated from the power device region 124 and are configured to accommodate logic dies for controlling a power circuit (e.g., half-bridge) formed by the dies mounted in the power device region 124. The depicted geometry illustrates just one example of potential configurations of a structured metallization layer 114 that can be provided on the power electronics carrier 100. In various embodiments, the structured metallization layer 114 can comprise conductive bond pads 116 configured to provide a power supply voltage to one or more semiconductor dies 120. Additionally, or alternatively, the structured metallization layer 114 can comprise interconnect lines that provide electrical interconnections between the various devices mounted thereon.

Figure 5:
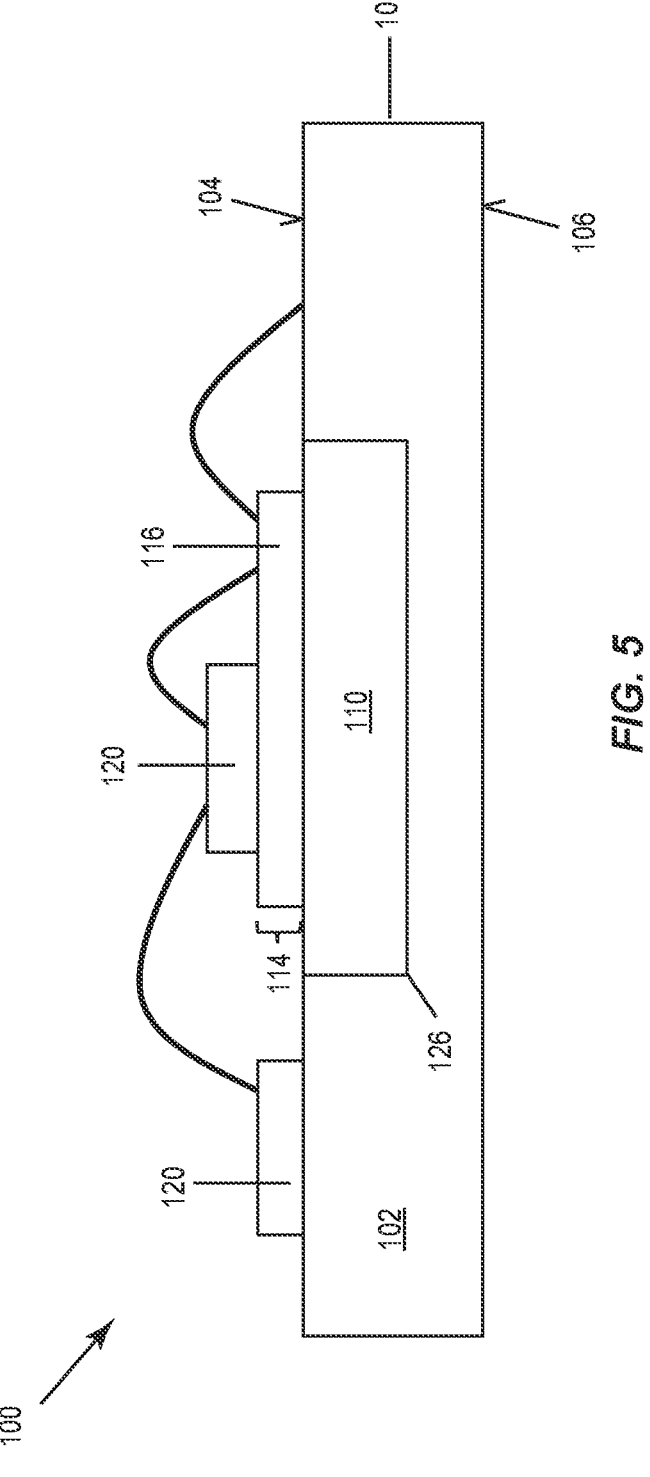
FIG. 5 illustrates a side-view of a power electronics carrier, according to an embodiment.

Referring to FIG. 5, an assembly that comprises two semiconductor dies 120 mounted on a power electronics carrier 100 is depicted, according to an embodiment. In this embodiment, the metal substrate 102 comprises a recess 126 that extends from the upper surface 104 towards the rear surface 106. The recess 126 can be formed by performing a metal processing technique such as coining, etching or milling to a substantially uniform thickness sheet of metal, e.g., steel. The region of electrical isolation material 110 is disposed within the recess 126. This region 110 can be formed by deposing non-crystalline material such as glass, e.g., using a deposition technique wherein capillary action is used to fill the recess 126. According to an embodiment, an upper surface of the region of electrical isolation material

110 is coplanar with the upper surface 104 of the metal substrate 102. A planarization process such as grinding may be performed to obtain this arrangement. A structured metallization layer 114 can be formed on the region of electrical isolation material 110, e.g., using the above-described thick-film deposition process.

In the assembly of FIG. 5, one of the semiconductor dies 120 is mounted on an electrically isolated bond pad 116 and another one of the semiconductor dies 120 is mounted on a region of the upper surface 104 of the metal substrate 102 that is adjacent to the recess 126. The semiconductor die 120 mounted directly on the metal substrate 102 may be a power transistor, e.g., IGBT, MOSFET, etc. In this configuration, the metal substrate 102 itself can form a direct electrical connection with a lower surface terminal of the semiconductor die 120 (e.g., a source terminal) mounted directly on the metal substrate 102. Meanwhile, the semiconductor dies 120 disposed on the region of electrical isolation material 110 can be isolated from this terminal. In another embodiment, a semiconductor die 120 may be mounted directly on the region of electrical isolation material 110, e.g., using adhesion such as glue, tape, etc. This arrangement may be preferable in high-frequency applications wherein the high dielectric constant of the non-crystalline material (e.g., glass) is advantageously used to isolate the first semiconductor die.

Figure 6:
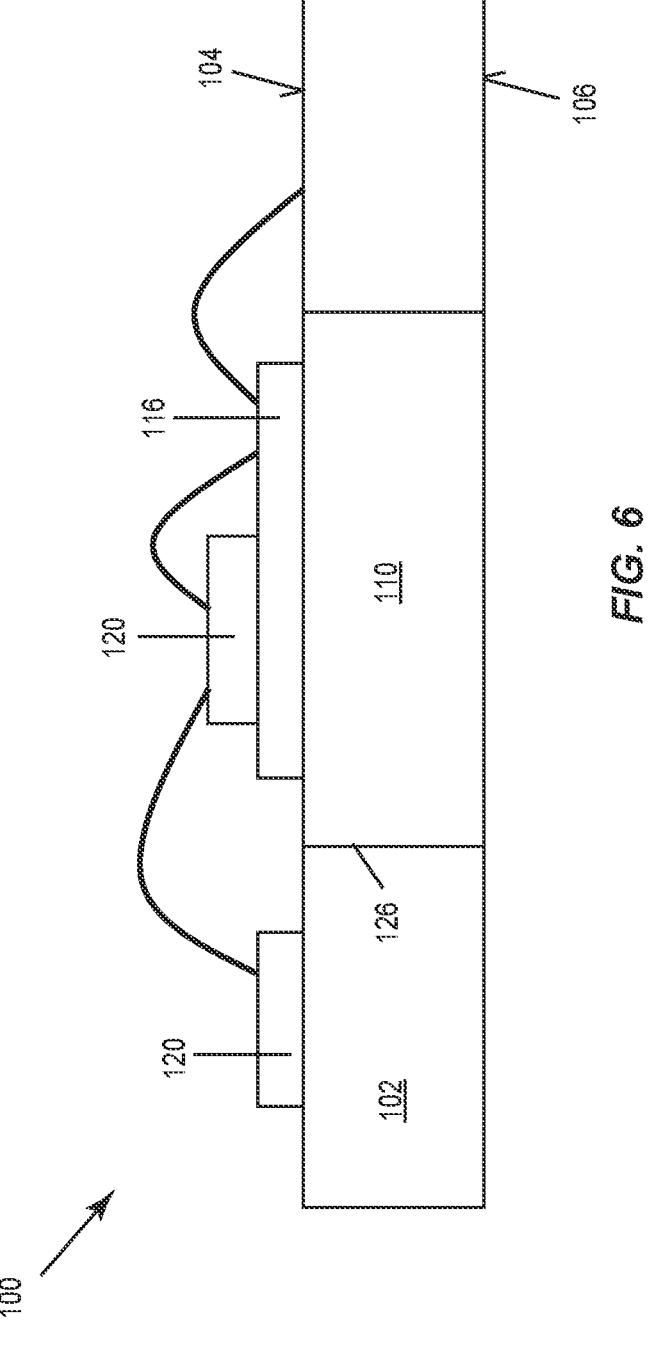
FIG. 6 illustrates a side-view of a power electronics carrier, according to an embodiment.

Referring to FIG. 6, an assembly that comprises two semiconductor dies 120 mounted on a power electronics carrier 100 is depicted, according to an embodiment. The assembly is identical to that of FIG. 5 except that the metal substrate 102 comprises an opening 128 instead of the recess 126. The opening 128 extends completely from the upper surface 104 of the metal substrate 102 to the rear surface 106 of the metal substrate 102. Moreover, the region of electrical isolation material 110 completely fills the opening 128 and thus extends from the upper surface 104 to the rear surface 106. Like the recess 126, the opening 128 can be formed by performing a metal processing technique such as coining, etching or milling. A rear surface of the region of electrical isolation material 110 can be coplanar with the rear surface 106 of the metal substrate 102, e.g., by performing planarization steps in a similar manner as described above.

Figure 7:
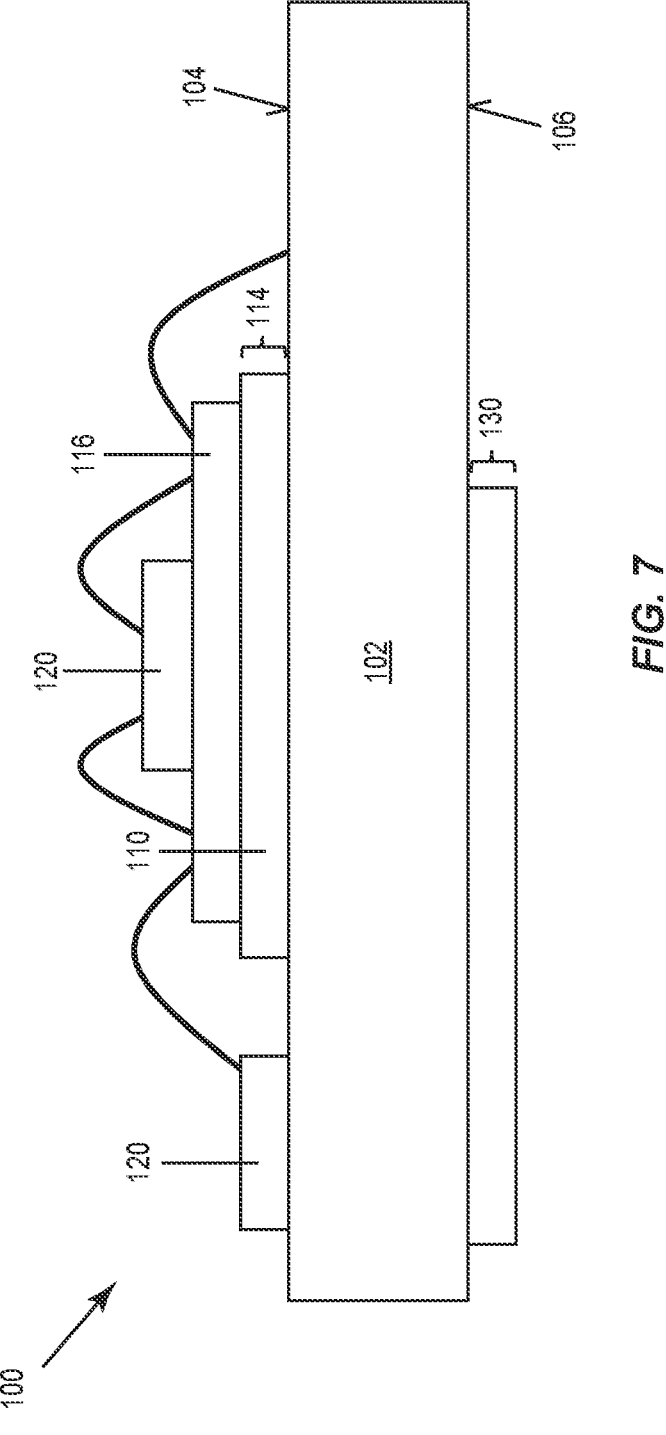
FIG. 7 illustrates a side-view of a power electronics carrier, according to an embodiment.

Referring to FIG. 7, an assembly that comprises two semiconductor dies 120 mounted on a power electronics carrier 100 is depicted, according to an embodiment. In this embodiment, the power electronics carrier 100 comprises a first layer 112 of the electrically insulating non-crystalline material disposed on an upper surface 104 of the metal substrate 102 and a second layer 130 of the electrically insulating non-crystalline material disposed on the rear surface 106. The first layer 114 is structured to form a region of electrical isolation material 110 for the mounting a semiconductor die 120 thereon in a similar manner as described above. The second layer 130 of the electrically insulating non-crystalline material can have the same composition and can be formed according to the same techniques as the first layer 112 of the electrically insulating non-crystalline material. The second layer 130 of the electrically insulating non-crystalline material is structured such that a portion of the rear surface 106 is exposed from the second layer 130 of the electrically insulating non-crystalline material. Thus, the metal substrate 102 is configured such that a portion of the rear surface 106 can be directly electrically contacted whereas another portion of the rear surface 106 is electrically insulated. This structure can mimic the lower surface profile of a power electronics substrate such as a DCB logic device.

Figure 8:
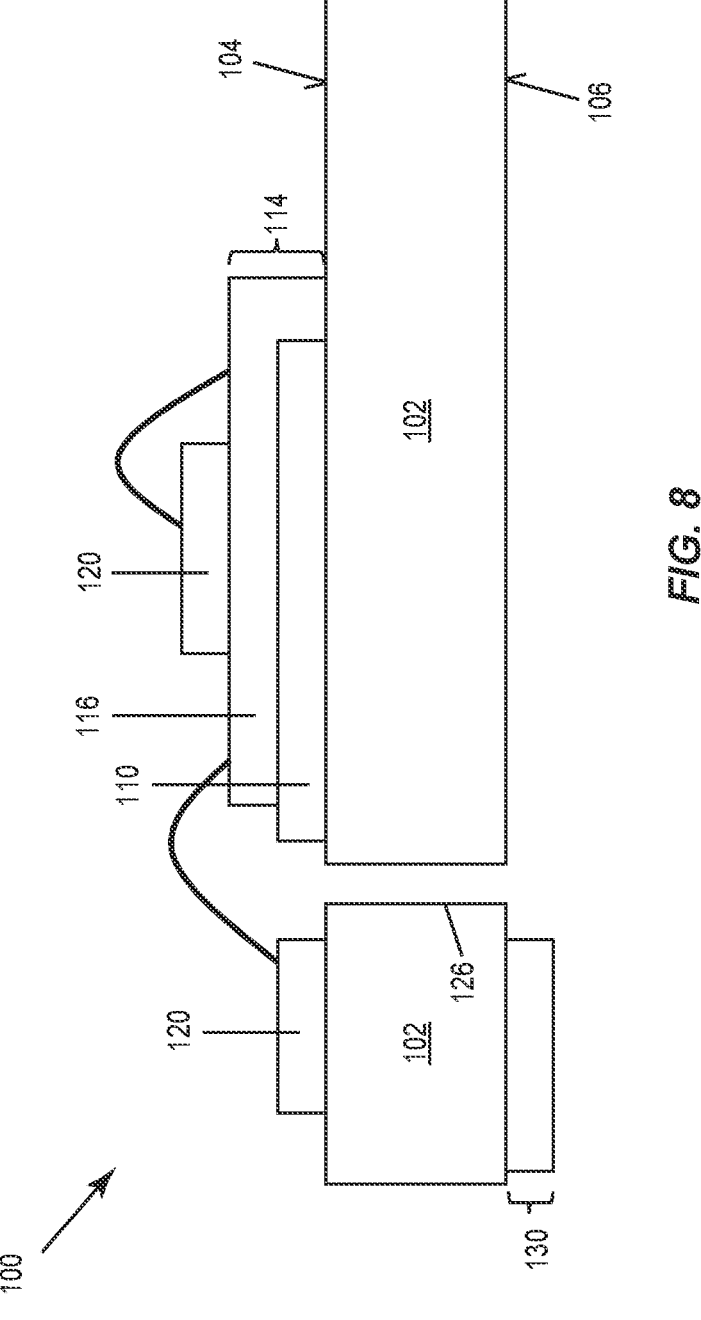
FIG. 8 illustrates a side-view of a power electronics carrier, according to an embodiment.

Referring to FIG. 8, an assembly that comprises two semiconductor dies 120 mounted on a power electronics carrier 100 is depicted, according to an embodiment. In this embodiment, structured metallization layer 114 is configured such that a bond pad 116 extends past a lateral edge side of the region of electrical isolation material 110 and directly contacts the upper surface 104 of the metal substrate 102. This arrangement can be obtained through appropriate configuration of the stencil or frame in the above described thick-film printing technique. This arrangement replaces the need for other electrical interconnect elements, e.g., bond wires, metal clips, etc., between the bond pad 116 and the metal substrate 102.

As shown in FIG. 8, the metal substrate 102 may be divided into multiple isolated sections by providing an opening 128 (or openings) that extend completely from the upper surface 104 to the rear surface 106. In the case of a molded package, this opening 128 may be filled with an electrically insulating encapsulant material. In the case of an open power module, these opening 128 may be filled with any type of electrical insulator, e.g., epoxy, glass, etc. In either case, this configuration allows for the metal substrate 102 to have multiple electrically active regions that can be biased at different potentials.

Disclosed herein is a semiconductor die 120. Generally speaking, the semiconductor die 120 can be any type of device. For example, the semiconductor die can be configured as a discrete device, e.g., diode, transistor, thyristor, etc., or an integrated circuit, e.g., amplifier, driver, controller, etc. The semiconductor die 120 can comprise type IV semiconductor materials, e.g., as silicon, silicon germanium, silicon carbide, etc., and/or type III-V semiconductor materials, e.g., gallium nitride, gallium arsenide, etc. The semiconductor die may be configured as a vertical device that is configured to control a current flowing between a main surface and an opposite facing rear surface 106, or a lateral device that is configured to control a current flowing parallel to a main surface. The semiconductor die 120 may be a discrete power device. A discrete power device refers to a discrete component that is rated to accommodate voltages of at least 100V and more commonly on the order of or more and/or currents of at least 1 A and more commonly on the order of 10 A or more. Discrete power devices include MOSFETs (Metal Oxide Semiconductor Field Effect Transistors), IGBTs (Insulated Gate Bipolar Transistors), and HEMTs (High Electron Mobility Transistors), for example.

Disclosed herein is an encapsulant body 202 of a semiconductor package 200. The encapsulant body 202 comprises an electrically insulating encapsulant material that seals and protects the semiconductor die and associated electrical connections. Examples of encapsulant materials include ceramics, epoxy materials thermosetting plastics, and composite laminate materials such as FR-4, to name a few. The encapsulant body 202 can be formed according to a wide variety of techniques including molding techniques such as injection molding, transfer molding, etc., and lamination techniques wherein a plurality of layers are successively stacked on top of one another.

Spatially relative terms such as "under," "below," "lower," "over," "upper" and the like, are used for ease of description to explain the positioning of one element relative to a second element. These terms are intended to encompass different orientations of the device in addition to different orientations than those depicted in the figures. Further, terms such as "first," "second," and the like, are also used to describe various elements, regions, sections, etc. and are also not intended to be limiting. Like terms refer to like elements throughout the description.

As used herein, the terms "having," "containing," "including," "comprising" and the like are open-ended terms that indicate the presence of stated elements or features, but do not preclude additional elements or features. The articles "a," "an" and "the" are intended to include the plural as well as the singular, unless the context clearly indicates otherwise.

With the above range of variations and applications in mind, it should be understood that the present invention is not limited by the foregoing description, nor is it limited by the accompanying drawings. Instead, the present invention is limited only by the following claims and their legal equivalents.

The invention claimed is:

1. A power electronics device, comprising:
   a power electronics carrier comprising a metal substrate that is non-corrosive and a region of electrical isolation material that forms a direct interface with the metal substrate;
   and
   a first semiconductor die mounted on the region of electrical isolation material, and
   wherein the region of electrical isolation material is a layer of glass that is disposed at the direct interface with the metal substrate, and
   wherein the non-corrosive metal substrate comprises steel, and
   wherein a coefficient of thermal expansion of the region of electrical isolation material substantially matches a coefficient of thermal expansion of metal from the metal substrate at the direct interface.

2. The power electronics device of claim 1, wherein the metal from the metal substrate at the direct interface is steel.

3. The power electronics device of claim 1, further comprising a first bond pad disposed on the region of electrical isolation material, and wherein the first semiconductor die is mounted on the first bond pad.

4. The power electronics device of claim 3, further comprising a second semiconductor die mounted on the power electronics carrier, and wherein the second semiconductor die is electrically isolated from the first semiconductor die by the region of electrical isolation material.

5. The power electronics device of claim 4, wherein the second semiconductor die is a power transistor, and wherein the first semiconductor die is a logic device that is configured to control the power transistor.

6. The power electronics device of claim 1, further comprising an encapsulant body of electrically insulating material that encapsulates the first semiconductor die.

7. The power electronics device of claim 6, further comprising a first lead that is electrically connected to the first semiconductor die and is exposed from the encapsulant body, and wherein the metal substrate and the first lead are constituent parts of a steel lead frame.

8. The power electronics device of claim 6, wherein a lower surface of the metal substrate that is opposite from the first semiconductor die is exposed from the encapsulant body.

9. The power electronics device of claim 1, wherein the layer of glass is a layer of any one of: quartz glass, silica glass, soda lime glass, photostructurable glass, float glass, polymer glass, acrylic glass, polycarbonate, and polyethylene terephthalate.

10. A power electronics carrier, comprising:
    a metal substrate that is non-corrosive; and a region of electrical isolation material that forms a direct interface with the metal substrate, and wherein a coefficient of thermal expansion of the region of electrical isolation material substantially matches a coefficient of thermal expansion of the metal of the metal substrate at the direct interface; and wherein the region of electrical isolation material is a layer of glass that is disposed at the direct interface with the metal substrate.

11. The power electronics carrier of claim 10, wherein the metal at the direct interface comprises steel.

12. The power electronics device of claim 10, wherein the layer of glass is a layer of any one of: quartz glass, silica glass, soda lime glass, photostructurable glass, float glass, polymer glass, acrylic glass, polycarbonate, and polyethylene terephthalate.

\* \* \* \* \*